United States Patent
Deboy et al.

(10) Patent No.: US 6,831,327 B2
(45) Date of Patent: Dec. 14, 2004

(54) VERTICALLY STRUCTURED POWER SEMICONDUCTOR COMPONENT

(75) Inventors: Gerald Deboy, München (DE); Jens-Peer Stengl, Grafrath (DE); Hans Weber, Ainring (DE); Armin Willmeroth, Augsburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/838,743

(22) Filed: Apr. 19, 2001

(65) Prior Publication Data

US 2002/0063280 A1 May 30, 2002

Related U.S. Application Data

(63) Continuation of application No. PCT/DE99/02604, filed on Aug. 19, 1999.

(51) Int. Cl.$^7$ .......................... H01L 29/94; H01L 23/62
(52) U.S. Cl. ..................... 257/328; 257/355; 257/288
(58) Field of Search ................................ 257/133–135, 257/328–330, 341–342, 354–355, 339

(56) References Cited

U.S. PATENT DOCUMENTS

| | | | | |
|---|---|---|---|---|
| 4,636,830 A | * | 1/1987 | Bhagat | 357/38 |
| 4,901,127 A | * | 2/1990 | Chow et al. | 357/23.4 |
| 5,387,528 A | * | 2/1995 | Hutchings et al. | 437/40 |
| 5,702,961 A | * | 12/1997 | Park | 437/40 |
| 5,821,586 A | * | 10/1998 | Yamaguchi et al. | 257/355 |
| 5,973,338 A | * | 10/1999 | Okabe et al. | 257/133 |
| 6,011,280 A | * | 1/2000 | Fruth et al. | 257/137 |
| 6,051,850 A | * | 4/2000 | Park | 257/233 |
| 6,204,717 B1 | * | 3/2001 | Nagasu et al. | 327/318 |
| 6,236,068 B1 | * | 5/2001 | Feiler | 257/133 |
| 2003/0160281 A1 | * | 8/2003 | Chen | 257/339 |

FOREIGN PATENT DOCUMENTS

| | | | |
|---|---|---|---|
| DE | 197 31 495 A 1 | 1/1999 | |
| EP | 0 061 551 A2 | 10/1982 | |
| EP | 0 222 326 A2 | 5/1987 | |
| EP | 0 503 605 A2 | 9/1992 | |
| JP | 404234173 A | * 8/1992 | H01L/29/784 |

OTHER PUBLICATIONS

Laska et al, "A 2000 V–Non–Punch–Through–IGBT with Dynamical Properties like a 1000 V–IGBT", Int. Electron Dev. Mtg., New York, IEEE, 1990 (pp. 807–810) (IDS, hence not provided herewith).*

T. Laska et al.: "A 2000 V–Non–Punch–Through–IGBT with Dynamical Properties like a 1000 V–IGBT", CH2865, 1990 IEEE, pp. 807–810, XP 000279629.

T. Laska et al.: "Ultrathin–Wafer Technology For A New 600V–NPT–IGBT", 0–7803–3993–2/97, IEEE, pp. 361–364, XP–000800221.

* cited by examiner

Primary Examiner—Minhloan Tran
Assistant Examiner—Johannes Mondt
(74) Attorney, Agent, or Firm—Laurence A. Greenberg; Werner H. Stemer; Ralph E. Locher

(57) ABSTRACT

A vertically structured semiconductor power component is described. A layer thickness of a substrate of the power module between a pn junction and a metallized back is chosen in such a manner that a space charge region produced in the semiconductor component extends as far as the back when a blocking voltage between a source and a drain electrode is applied before a field strength produced by the applied blocking voltage reaches a critical value.

6 Claims, 2 Drawing Sheets

VERTICALLY STRUCTURED POWER SEMICONDUCTOR COMPONENT

CROSS-REFERENCE TO RELATED APPLICATION

This application is a continuation of copending International Application No. PCT/DE99/02604, filed Aug. 19, 1999, which designated the United States.

BACKGROUND OF THE INVENTION

Field of the Invention

The present invention relates to a vertically structured power semiconductor component having a semiconductor body of a first conductivity type, a first main surface and a second main surface opposite the first main surface. A body zone of a second conductivity type, opposite of the first conductivity type, is introduced into the first main surface. A zone of the first conductivity type, is provided in the body zone. A first electrode makes contact with the zone of the first conductivity type and with the body zone. A second electrode is provided on the second main surface, and a gate electrode, is disposed above the body zone and is separated from the latter by an insulating layer.

In semiconductor power components, it is desirable to carry the largest possible current through the smallest possible area. In order to optimize the channel width/channel length or area ratio, power semiconductor components are therefore built from a large number of cells connected in parallel, in each of which the current path runs in the vertical direction, i.e. from one main surface of the semiconductor body to its other main surface. In this way, all of the semiconductor material placed under the actual cell in question, i.e. as far as the back terminal placed on the other main surface, is used as an active volume.

It will be assumed below that the power semiconductor component is an n-channel power MOS field-effect transistor, in which the source and gate terminals are located on one main surface of the semiconductor body, the chip top, and the drain terminal is located on the other main surface of the semiconductor body, the chip bottom.

The ideas below, however, can also be applied readily to other power semiconductor components, for example insulated gate bipolar transistors (IGBT) etc.

A power semiconductor component receives the voltage applied to it through mutual depletion of neighboring p- and n-conductive regions by mobile charge carriers, so as to create a space charge zone. In an n-channel power MOS field-effect transistor, spatially fixed charges created in a p-conductive well hence find their "mirror charges" primarily in a vertically adjacent n-conductive layer, which is normally produced by epitaxy. The maximum of the electric field always occurs at the pn junction between the p-conductive well and the semiconductor body. Electrical breakdown is reached when the electric field exceeds a material-specific critical field strength $E_c$: this is because multiplication effects then lead to the creation of free charge carrier pairs, so that the blocking-state current suddenly increases greatly. But since, as is know, charges are the sources of any electric field, this critical field strength $E_o$ can be assigned an equivalent critical breakdown surface charge $Q_c$ according to the first Maxwell equation. For silicon, for example, $E_c = 2.0 \ldots 3.0 \times 10^5$ V/cm and $Q_c$ 1.3–1.9×10$^{12}$ charge carriers cm$^{-2}$. Since each charge carrier has the charge of e (electronic charge=1.6×10$^{-19}$ As), $Q_c$ can take values from 2.08–3.04×10$^{-7}$As.cm$^{-2}$. The exact value of $Q_c$ depends in this case on the level of the doping.

The voltage reduction in a power semiconductor component, which takes place in the cell array in the lower-lying volume of the semiconductor body, must also be defined toward its edge, a profile in the horizontal direction being desirable in this case. Elaborate surface-positioned equipotential structures are commonly employed in order to achieve this.

The breakdown response of power semiconductor components can be evaluated in static measurements. An "avalanche test", however, in which the switching response is also tested in addition to the actual breakdown, is much more meaningful. In this case, different regions of the safe operating area (SOA) are run through during a test. The purpose of such measurements is to simulate the "worst case" for user applications. In order to comply with the various requirements, a power semiconductor component must, in particular, meet the below listed criteria.

First, during electrical breakdown, an impressed high current due to charge-carrier multiplication flows from the external circuit. In order to prevent destruction of the power semiconductor component, however, excessively high current densities should be avoided. Therefore, the breakdown current must be distributed as uniformly as possible across the semiconductor body, or chip. But this criterion can only be met if the actual cell array carries the major part of the breakdown current. The reason is that if the power semiconductor component breaks down in its edge structure at lower voltages than the cell array, this usually causes irreversible thermal damage to the semiconductor body, or chip. The difference in blocking voltage between the edge region and the cell array must hence be made large enough so that fabrication tolerances do not shift the breakdown towards the edge region. In general, it may hence be stated that the voltage strength of the edge region must be higher than that of the cell array.

Second, owing to fabrication tolerances, the electrical breakdown never takes place homogeneously across the entire semiconductor body, or chip. Instead, the breakdown is defined by the "weakest" cell. So in order to achieve homogenization across the cell array, the voltage at such weakest cells must become higher as the breakdown current grows, since other cells will then also enter breakdown and in turn "shift" their voltage. This distributes the "avalanche current" uniformly across the cell array. In standard power semiconductor components, the heating of the semiconductor material is normally sufficient to ensure a positive differential current/voltage response. Dynamic doping effects in which, for example, the effects of mobile charge carriers from the breakdown current are to be added to the background doping, can also facilitate such a characteristic.

In any case, the power semiconductor component should have a positive differential current/voltage response in the event of electrical breakdown.

Third, in MOS transistors, as is known, each cell contains a "three-layer system" which contains a source zone, a body zone and a drain zone, and can act as a parasitic bipolar transistor for holes created in breakdown. The base of this bipolar transistor is in this case formed by the p-conductive well. If this base then experiences a voltage drop in the region of about 0.7 V as a result of the hole current, then the bipolar transistor is switched on and draws more and more current without any further way of controlling it, until the power semiconductor component is finally destroyed. This behavior is ultimately due to the negative temperature/resistance curve for bipolar transistors. However, such effects can be counteracted by configuration precautions.

One very effective way is to avoid crossover currents at the surface, i.e. to place the electrical breakdown as deeply and centrally as possible below each cell. In other words, parasitic bipolar effects should be avoided wherever possible.

SUMMARY OF THE INVENTION

It is accordingly an object of the invention to provide a vertically structured power semiconductor component that overcomes the above-mentioned disadvantages of the prior art devices of this general type, in which a simple configuration is used to ensure that any electrical breakdown reliably occurs in the cell array.

With the foregoing and other objects in view there is provided, in accordance with the invention, a vertically structured power semiconductor component. The power semiconductor components contains a semiconductor body of a first conductivity type that has a first main surface and a second main surface opposite the first main surface. A body zone of a second conductivity type opposite of the first conductivity type is introduced into the first main surface. A zone of the first conductivity type is disposed in the body zone. A first electrode makes contact with the zone and with the body zone. A second electrode is disposed on the second main surface. An insulating layer is disposed on the first main surface. A gate electrode is disposed above the body zone and is separated from the body zone by the insulating layer. An intersection of the semiconductor body and the body zone defines a pn junction. The semiconductor body has a layer thickness between the pn junction and the second main surface selected such that, when one of a maximum allowed blocking voltage and a voltage just less than this, is applied between the first electrode and the second electrode, a space charge zone created in the semiconductor body meets the second main surface before a field strength created by an applied blocking voltage reaches a critical value.

The object is achieved in the case of a vertically structured power semiconductor component of the type mentioned at the start, according to the invention, such that the layer thickness of the semiconductor body between the pn junction formed at the intersection of the semiconductor body and the zone of the other conductivity type and the second semiconductor surface is selected in such a way that, when a maximum allowed blocking voltage, or a voltage just less than this, is applied between the first and second electrodes, the space charge zone created in the semiconductor body meets the second main surface, or just touches it, before the field strength created by the applied blocking voltage reaches the critical value $E_c$.

This dimensioning rule for the layer thickness of the semiconductor body between the pn junction and the second main surface is based on the following ideas.

When the power semiconductor component is in the off state, if the voltage between, for example, the source and the drain is increased stepwise, then the space charge zone spreads ever further, starting from the pn junction between the p-conductive well and the drain zone, into the n-conductive region of the drain zone. If the space charge zone meets regions with crystal defects, or intrinsically conductive noncrystalline regions, then electron-hole pairs will be emitted by these regions and, according to the potential gradient, the holes will flow through the space charge zone to the first main surface, or front, and the electrons will flow to the second main surface, or back, of the semiconductor body. This effect increases the blocking voltage and is actually to be regarded as "parasitic". If, however, the blocking-state current increases very strongly with a small voltage change, i.e. the space charge zone reaches a very extensive region with crystal defects, then this can be utilized for breakdown. This is precisely the effect which the present invention now exploits.

The layer thickness of the semiconductor body, i.e. ultimately the chip thickness, is selected in such a way that the space charge zone meets the metallized second main surface before the critical field strength $E_c$ has yet been reached in the bulk of the semiconductor body. It is, however, sufficient per se if the space charge zone just touches the second main surface when the critical field strength is reached, or meets this surface when the latter has been exceeded very slightly. Holes are then emitted into the bulk of the semiconductor body by the second-electrode metallization provided on the second main surface, so that the conditions for "punch-through" are satisfied. The electrons associated with the holes then pass from the metallization of the second main surface, through the external circuitry, to the voltage source that applies the blocking voltage to the source and drain.

This punch-through breakdown does in fact lower the blocking voltage of the power semiconductor component. If the configuration is appropriate, however, numerous advantages that can optimize the avalanche behavior are obtained.

First, the breakdown takes place in a reliable and defined way on the second main surface, or back, of the power semiconductor component, i.e. "far away" from the parasitic bipolar transistors near the surface. Since the holes created in the breakdown follow the potential gradient, they flow at right angles to the first main surface, i.e. at right angles to the front of the chip. Near the first main surface, the electric field is distorted as a result of the p-conductive wells to such an extent that a "funnel effect" occurs for the electric field toward the contact holes that are provided in the first main surface. This almost completely prevents any horizontally-flowing electric currents near the surface in the vicinity of the first main surface. Precautions that usually need to be taken against the parasitic bipolar effect in standard power semiconductor components therefore become unnecessary.

Second, by use of surface-positioned magneto-resistors, the space charge zone is drawn, usually at the edge of the semiconductor body, toward the first main surface, or front, and opens at the latest on a so-called "channel stopper" into a front oxide provided on the main surface. By exploiting the punch-through effect, moreover, the breakdown is automatically established under the cell array since the space charge zone extends more deeply there, and already meets the metallization of the second main surface at smaller voltages before regions below the edge of the semiconductor body.

Third, the amplitude of the breakdown voltage is dictated primarily by the geometrical size "layer thickness of the semiconductor body", or "chip thickness", rather than by the material-dependent critical field strength $E_c$ as in the case of previous power semiconductor components. This provides advantages, above all, in the case of so-called compensation components whose breakdown voltage generally depends parabolically on the charge balance in the semiconductor bulk, i.e. on fabrication tolerances as well. Through exploitation of the punch-through effect, the breakdown is "clamped" here and this leads to flattening of the so-called compensation parabola, and hence to homogenization of the dependency of the breakdown on the material.

The vertically structured power semiconductor component according to the invention can be produced in a relatively simple way.

After the so-called front processing on the first main surface, the wafer with the individual chips, or semiconductor bodies, is thinned to a wafer thickness which, according to the configuration of the intended power semiconductor component, allows punch-through of the space charge zone to the back. To that end, it is possible to use thin wafer technologies as are known from the prior art (see the reference by T. Laska, M. Matschitsch, and K. Scholtz, titled "Ultrathin Wafer Technology For A New 600 V IGBT", ISRSD '97, pages 361–364).

Although the thinning of a wafer entails additional costs, these can nevertheless be "neutralized". When unthinned wafers are used, it is necessary to position a heavily doped substrate below the high-impedance semiconductor volume that is used for the voltage reduction in the blocking case. This does not fulfill any necessary electrical function; it only serves, so to speak, as a support material that is intended to contribute as little as possible to the switch-on voltage in the on state, and may optionally be used as a field stop zone. However, such wafers are expensive since the layer that receives the voltage is applied on the support material by an elaborate epitaxy process. But this kind of low-impedance support material is no longer needed in thin wafer technology, so that it is possible to work with less costly substrate wafers.

Beside regions of the second main surface, i.e. the back regions, through which the space charge zone punch-through takes place and which therefore need to be doped relatively lightly (the so-called punch-through regions), it is also necessary to define areas that ensure good contact with the metallization, i.e. ones which have low impedance. Punch-through regions hence need to be provided in alternation with terminal regions.

The doping concentration for the punch-through regions is dictated by the doping of the semiconductor body, i.e. the substrate doping, or it may also be varied by surface-wide back implantation. The incorporation of a weak field stop layer may possibly be advantageous in order to increase the blocking voltage of the power semiconductor component (see German Patent DE 197 31 495 C2).

To define the low-impedance terminal regions, it is necessary to structure the second main surface. This may be done, for example, by implantation through a photoresist mask. By appropriately setting the "terminal region/punch-through region" area ratio, it is possible to control the hole injection in punch-through breakdown and hence the current/voltage characteristic in breakdown. The homogenization behavior of the breakdown across the second main surface can hence be deliberately influenced, and the point on the current/voltage curve beyond which a negative differential response is obtained, the so-called "snap-back" point, can be optimized.

It was explained above that, in the event of punch-through breakdown, the space charge zone directly adjoins the metallization of the second main surface, which results in that it is necessary to use thin wafer technology. An alternative possibility, however, is to make the space charge zone punch through onto a p-doped layer on the second main surface instead of onto the metallization. The p-doped layer hence acts as a hole injector. With this method, according to the configuration of the p-doped layer, it is possible to adapt to thicker semiconductor bodies, or wafers. Unfortunately, a disadvantage with this approach is that, in the undepleted on state, the p-doped layer acts as a collector so that the power transistor behaves like an IGBT. In other words, parameters typical of a MOS transistor may become strongly affected.

In accordance with an added feature of the invention, the layer thickness of the semiconductor body has a specific sheet charge density $[\rho]\rho_F$ in a direction z between the pn junction and the second main surface such that:

$$\int_0^W \rho(z)dz \leq 0.9 q_c,$$

$$\rho_F = \int \rho\, dF$$

in which $\rho$ is the volume charge density, $Q_c$, the critical breakdown charge, denotes a critical value of the charge quantity Q at which the electrical breakdown is reached, said charge quantity Q being linked to said electric field strength E between said first electrode and said second electrode by the equations $$\int_0^W \rho_F(z)dz = Q$$

and Poisson's equation $\nabla E = 4\pi\rho$.

In accordance with an additional feature of the invention, the semiconductor body has heavily doped terminal regions of the first conductivity type disposed at the second main surface.

In accordance with another feature of the invention, a further zone of the first conductivity type is disposed in a vicinity of the second main surface.

In accordance with a further feature of the invention, the semiconductor body has punch-through regions disposed between the heavily doped terminal regions, and a current/voltage characteristic in breakdown can be controlled through an area ratio between the heavily doped terminal regions and the punch-through regions.

In accordance with another added feature of the invention, the semiconductor body has an edge termination and a channel stopper is disposed in an area of the edge termination.

In accordance with another additional feature of the invention, a source magnetoresistor is disposed above the first main surface.

In accordance with another further feature of the invention, a compensation region of the second conductivity type is disposed below the body zone in the semiconductor body.

In accordance with a further added feature of the invention, the compensation region of the second conductivity type is produced by a plurality of epitaxy and implantation operations.

In accordance with a further additional feature of the invention, the compensation region of the second conductivity type is produced horizontally between the first main surface and the second main surface through the same implantation openings.

In accordance with a concomitant feature of the invention, the semiconductor body has an edge region and including vertical compensation areas of the second conductivity type disposed in the edge region.

Other features which are considered as characteristic for the invention are set forth in the appended claims.

Although the invention is illustrated and described herein as embodied in a vertically structured power semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
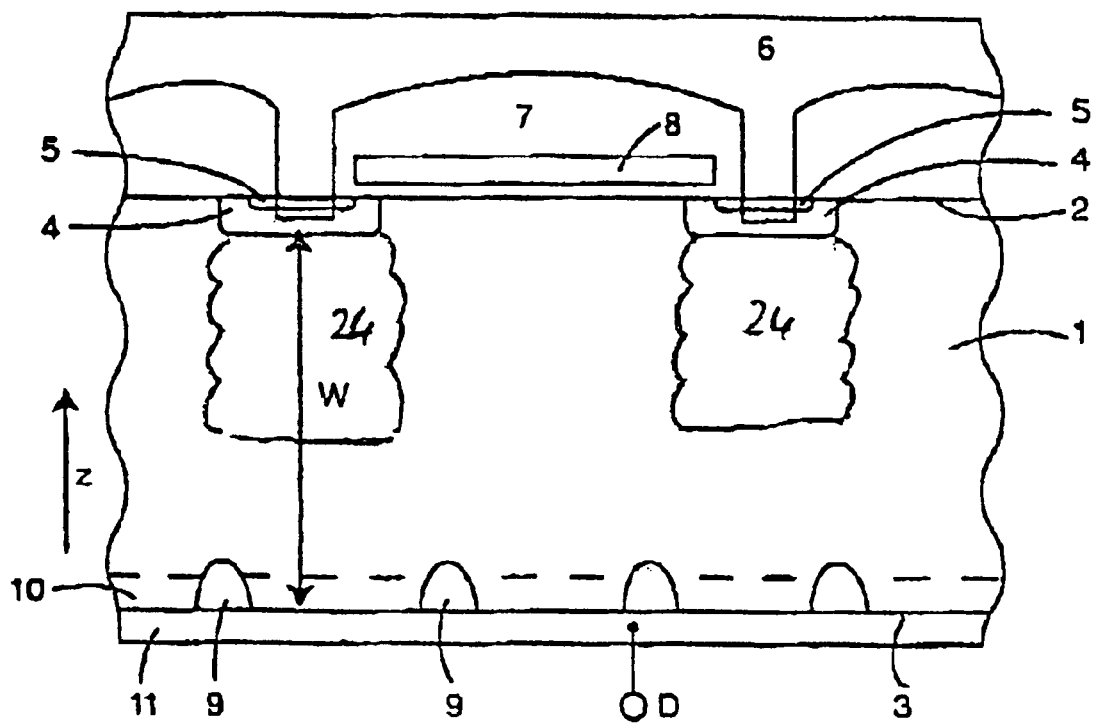
FIG. 1 is a diagrammatic, sectional view of a vertically structured power semiconductor component according to the invention.

As already mentioned in the introduction, the invention is described with reference to an n-channel power MOS field-effect transistor with a vertical structure. The invention is not, however, restricted to this. By reversing the conductivity types, of course, it is also possible to produce a p-channel power MOS field-effect transistor. Likewise, the invention can be used in the case of other components, for example insulated gated bipolar transistors (IGBTs).

In all the figures of the drawing, sub-features and integral parts that correspond to one another bear the same reference symbol in each case. Referring now to the figures of the drawing in detail and first, particularly, to FIG. 1 thereof, there is shown an n⁻-conductive semiconductor body 1 having a first main surface 2 and a second main surface 3. A p-conductive well or body zones 4, which in turn contain n⁺-conductive source zones 5, are introduced in the vicinity of the first main surface 2. The source zones 5 are provided with a source metallization 6, which essentially extends over an insulating layer 7 that is formed of silicon dioxide, and into which a gate electrode 8 is introduced in the region above the body zone 4.

n⁺-conductive terminal regions 9, which make good electrical contact with a back metallization 11, for example of aluminum, that is applied as a drain electrode D on the second main surface 3, or back, of the semiconductor body 1, are provided in the vicinity of the second main surface 3. Optionally, an n-conductive layer 10 may further be disposed in the vicinity of the back.

Figure 2:
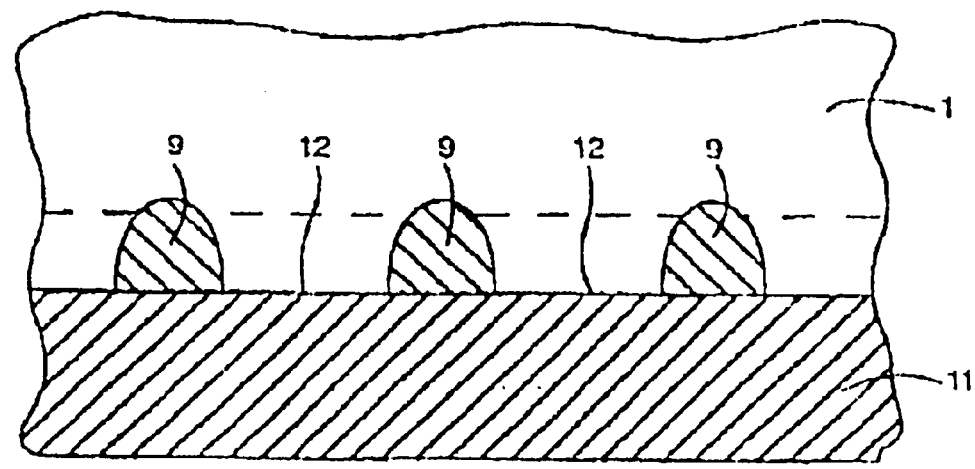
FIG. 2 is an enlarged sectional view of a vicinity of a second main surface in the power semiconductor component.

FIG. 2 shows the back of the power semiconductor component shown in FIG. 1 on an enlarged scale. FIG. 2 illustrates, in particular, the terminal regions 9 and punch-through regions 12, an area ratio of which establishes the hole injection in punch-through breakdown and hence permits control of the current/voltage characteristic in breakdown.

A layer thickness W of the semiconductor body 1 between the pn junction between the semiconductor body 1 and the body zone 4 and, the second semiconductor surface 3 is selected in such a way that, when the blocking voltage is applied between the source metallization 6 and the drain electrode D, a space charge zone created in the semiconductor body meets the second main surface 3 before the field strength created by the applied blocking voltage reaches a critical value $E_c$.

The critical value $E_c$ of the field strength is linked to a charge density ρ by Poisson's equation $$\vec{\nabla}\cdot\vec{E}=4\pi\rho, \tag{1}$$

so that a relationship with a critical breakdown surface charge $Q_c$ can be derived:

$$\int_0^W \rho(z)dz \leq Q_c \tag{2}$$

$W_{sc}$ denotes the width of the space charge region (i.e. the region with $|\vec{E}|\neq 0$) when the electric field reaches the critical field strength $E_c$. According to the invention, the layer thickness W should then be selected in such a way that the space charge zone reaches the second main surface 3 before the field strength takes on the critical value $E_c$. In this case, the integration in following equation (3) has to be carried out over the entire layer thickness W of the semiconductor body 1 between the pn-junction between the semiconductor body 1 and the zone 4 and the second semiconductor surface 3. In other words, the integral in Equation (2) should, for example, reach at most the value 0.9 $Q_c$ so that, in the vertically structured power semiconductor component according to the invention, the following equation is satisfied:

$$\int_0^W \rho(z)dz \leq 0.9q_c, \tag{3}$$

$\rho_F = \int \rho dF$

Figure 3:
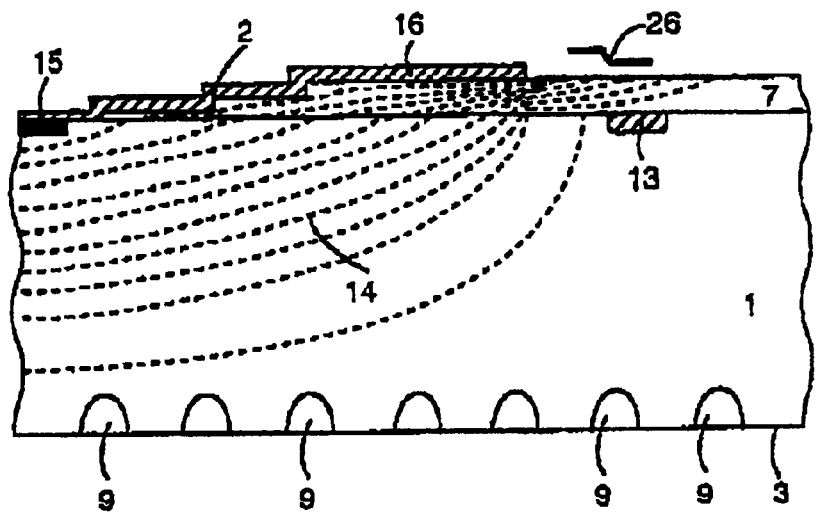
FIG. 3 is a sectional view of a profile of equipotential lines under an edge termination in the power semiconductor component.

FIG. 3 shows an edge termination of a power semiconductor component having a p⁺-conductive source zone 15, a source magnetoresistor 16 and a channel stopper 13, which is provided with a magnetoresistor 26 and is n⁺-doped. The semiconductor body 1 is n⁻-conductive as in the exemplary embodiment above. Further, the profile of equipotential lines 14 can be seen from FIG. 3.

As shown in FIG. 3, the breakdown is fixed below the cell array in the power semiconductor component according to the invention, since the space charge zone (see the equipotential lines 14) extends more deeply there, and hence already meets the metallization on the second main surface 3 at smaller voltages before this happens for regions below the edge.

Figure 4:
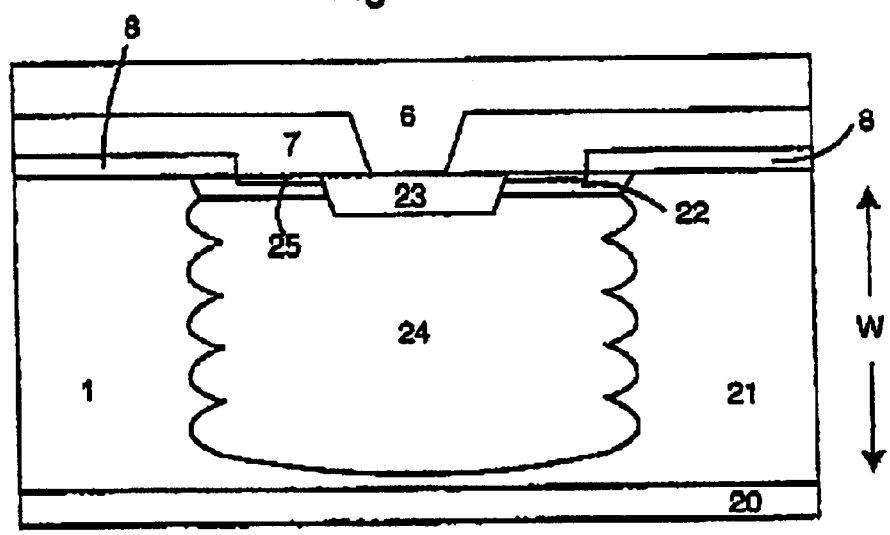
FIG. 4 is a sectional view through a compensation component.

FIG. 4 schematically shows a compensation component, in which an n-conductive epitaxial layer 21, which contains a p-conductive well 22, a p⁺-conductive body zone 23 and an n⁺-conductive source zone 25, is provided on an n⁺-conductive substrate 20. Further, a p-conductive "column" 24 which, for example, is produced by several epitaxies in combination with implantations, is provided for "compensation".

In the power semiconductor component, vertically extending p-conductive and n-conductive areas, so-called "columns", are disposed next to one another in the active volume below the source metallization 6. In the on state, there is hence an uninterrupted low-impedance conductivity path from the source terminal, or the metallization 6, to the drain terminal, or the n⁺-conductive substrate 20.

Each of the two charge areas or "columns" must contain only a fraction of the critical breakdown surface charge, seen in the horizontal direction, so that the horizontal surface charge is smaller than the critical breakdown surface charge $Q_c$. In the blocking case, the voltage is received by the power semiconductor component through mutual depletion of neighboring p-conductive and n-conductive areas. In other words, the carriers of one area electrically "compensate" for those of the oppositely charged area. In the individual planes, at low voltages, this leads to an electric field which is primarily directed horizontally.

As the voltage between the source and the drain rises, an increasing part of the volume becomes horizontally depleted, until at least one of the two "columns" disposed next to each other is fully exhausted of charge carriers. A horizontal electric field $E_h$ has then reached a maximum value $E_{Bh}$. As the voltage rises further, the depletion of the n$^+$-conductive substrate 20, or of deeper-lying surface-wide epitaxial layers, or of the p-conductive well 22, begins so that a vertical electric field $E_v$ then builds up.

Breakdown is reached when the vertical field reaches a value $E_{Bv}$ for which:

$$E_c = |\vec{E}_{Bv} + \vec{E}_{Bh}| \rightarrow E_{Bv} = \sqrt{E_c^2 - E_{Bh}^2}. \qquad (4)$$

If the dimensions of the individual cells are appropriate, the horizontal field $E_{Bh}$ only takes on relatively low values even if the columns are heavily doped, which results in a low switch-on resistance $R_{on}$, so that the vertical field $E_{Bv}$ is of the order of magnitude of $E_c$. Therefore, in spite of a low switch-on resistance $R_{on}$, such a compensation component makes it possible to block high voltages.

When the doping conditions in the columns are appropriate, it is also possible to configure compensation elements in such a way that there is an almost linear dependency between the blocking voltage and the switch-on resistance.

The application of the present invention to compensation components offers the below listed special advantages.

Since the punch-through breakdown takes place in the cell array rather than at the edge, the requirement that the edge needs to block more voltage than the cell array can be eliminated. The structure of the cell array may therefore be continued unchanged as far as the edge. Therefore, the implantation openings in the individual epitaxial layers no longer need to differ between the cell array and the edge, as in the case with previous standard compensation components.

Figure 5:
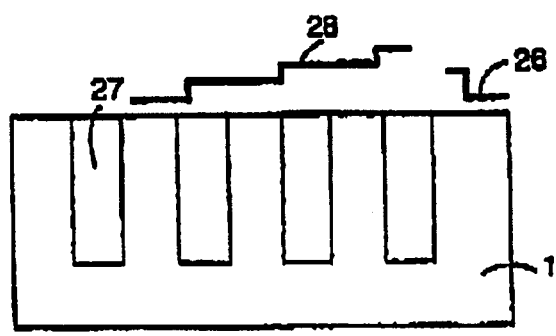
FIG. 5 is a view of an edge termination for a compensation component.

A preferred field of application of the invention hence involves compensation components in which columnar, vertically extending and p-doped compensation areas 27 (corresponding to the "column" 24) are incorporated, for example, in the n-conductive semiconductor body 1. An edge structure for this, having a magnetoresistor 28 and the channel-stopper magnetoresistor 26, is shown in FIG. 5.

Another advantage of the present invention is the fact that, in the event of breakdown in the vicinity of the second main surface, or back, only holes are injected into the semiconductor bulk. These, however, exhibit much weaker capacities for multiplication than electrons that would be created in the semiconductor body, together with the holes, in the event of standard field breakdown.

We claim:

1. A vertically structured power semiconductor component, comprising:

a semiconductor body of a first conductivity type and having a first main surface and a second main surface opposite said first main surface;

a body zone of a second conductivity type opposite of said first conductivity type introduced into said first main surface;

a zone of said first conductivity type disposed in said body zone;

a first electrode making contact with said zone and with said body zone;

a second electrode disposed on said second main surface;

an insulating layer disposed on said first main surface;

a gate electrode disposed above said body zone and separated from said body zone by said insulating layer;

an intersection of said semiconductor body and said body zone defining a pn junction; and a compensation region of said second conductivity type disposed below said body zone in said semiconductor body, said compensation region including columnar, vertically extending compensation areas;

said semiconductor body having:

a layer thickness between said pn junction and said second main surface selected such that, when one of a maximum allowed blocking voltage and a voltage just less than this is applied between said first electrode and said second electrode, a space charge zone created in said semiconductor body meets said second main surface before a field strength E created by an applied blocking voltage reaches a critical value $E_c$ at which an avalanche breakdown is reached;

heavily doped terminal regions of said first conductivity type disposed at said second main surface; and punch-through regions of said first conductivity type disposed between said heavily doped terminal regions, a current/voltage characteristic in breakdown being controlled through an area ratio between said heavily doped terminal regions and said punch-through regions.

2. The vertically structured power semiconductor component according to claim 1, wherein said semiconductor body has an edge termination and including a channel stopper disposed in an area of said edge termination.

3. The vertically structured power semiconductor component according to claim 2, including a source magnetoresistor disposed above said first main surface.

4. The vertically structured power semiconductor component according to claim 1, wherein said compensation region of said second conductivity type is produced by a plurality of epitaxy and implantation operations.

5. The vertically structured power semiconductor component according to claim 4, wherein said compensation region of said second conductivity type is produced horizontally between said first main surface and said second main surface through same implantation openings.

6. The vertically structured power semiconductor component according to claim 1, further comprising a further zone of said first conductivity type disposed in a vicinity of said second main surface.

* * * * *

UNITED STATES PATENT AND TRADEMARK OFFICE
CERTIFICATE OF CORRECTION

PATENT NO. : 6,831,327 B2 Page 1 of 1
DATED : December 14, 2004
INVENTOR(S) : Gerald Deboy et al.

It is certified that error appears in the above-identified patent and that said Letters Patent is hereby corrected as shown below:

<u>Title page,</u>
Item [63], Related U.S. Application Data, should read as follows:
-- Continuation of application No. PCT/DE99/02604, filed on August 19, 1999 --

Signed and Sealed this

Twenty-fourth Day of May, 2005

JON W. DUDAS
*Director of the United States Patent and Trademark Office*